United States Patent [19]

Schmersal et al.

[11] 4,056,806
[45] Nov. 1, 1977

[54] INTERFACING CIRCUITRY AND METHOD FOR MULTIPLE DISCHARGE GASEOUS DISPLAY AND/OR MEMORY PANELS

[75] Inventors: Larry J. Schmersal, Toledo, Ohio; William E. Johnson, Temperance, Mich.

[73] Assignee: Owens-Illinois, Inc., Toledo, Ohio

[21] Appl. No.: 340,783

[22] Filed: Mar. 13, 1973

Related U.S. Application Data

[63] Continuation-in-part of Ser. No. 161,853, July 12, 1971, which is a continuation-in-part of Ser. No. 699,170, Jan. 19, 1968, Pat. No. 3,618,071.

[51] Int. Cl.² .......................... G08B 5/36; H01J 17/48
[52] U.S. Cl. ........................ 340/166 EL; 315/169 R; 340/324 M
[58] Field of Search .................... 315/169; 340/324 R, 340/324 M, 166 EL, 173 R

[56] References Cited

U.S. PATENT DOCUMENTS

| 3,499,167 | 3/1970 | Baker et al. | 315/169 TV |
|---|---|---|---|
| 3,559,190 | 1/1971 | Bitzer et al. | 340/173 |
| 3,618,071 | 11/1971 | Johnson et al. | 340/324 M |
| 3,671,938 | 6/1972 | Ngo | 340/166 |
| 3,761,773 | 9/1973 | Johnson et al. | 340/324 M |

*Primary Examiner*—Donald J. Yusko
*Attorney, Agent, or Firm*—Donald Keith Wedding

[57] ABSTRACT

An interface circuit and method for multiple discharge gaseous display and/or memory panels utilizing the slope characteristics of individual discharge units in a multiple discharge panel to control the status of individual units without effecting the status of other individual discharge units. A low level voltage signal from an addressing logic system is translated into a high voltage unidirectional pulse which is added to a periodic alternating voltage at selected times to modify the slope of discharge potential of a charge storage discharge unit to control on and off states of selected discharge units.

2 Claims, 8 Drawing Figures

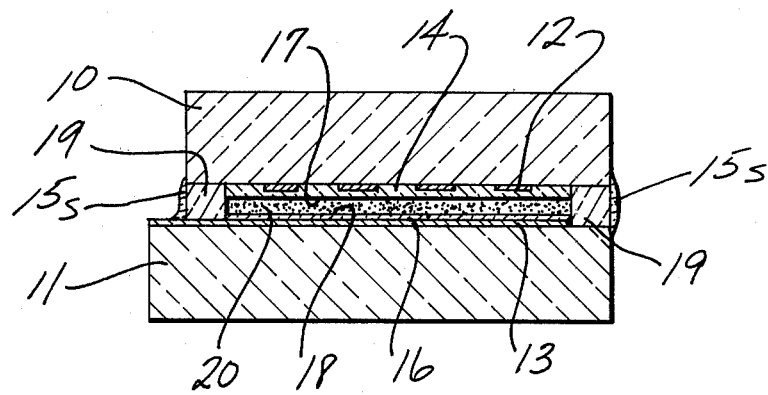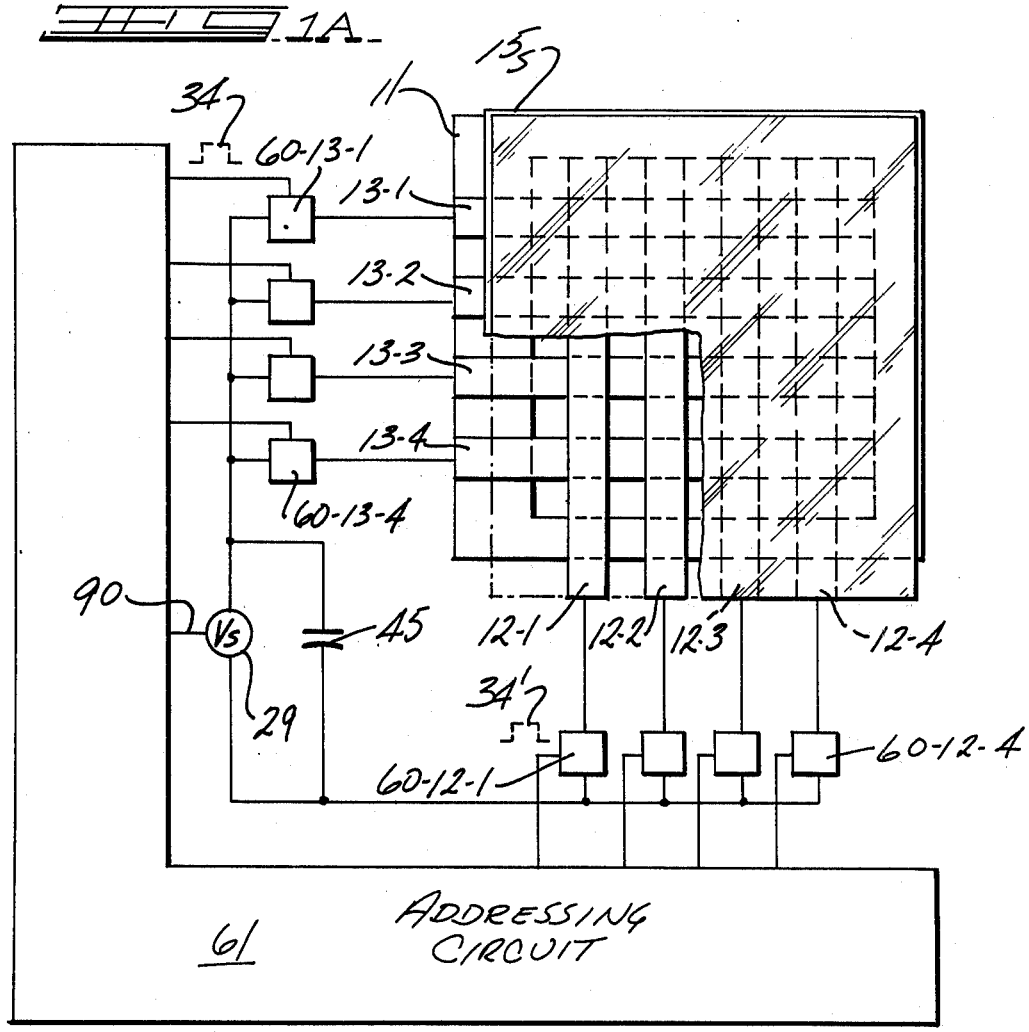

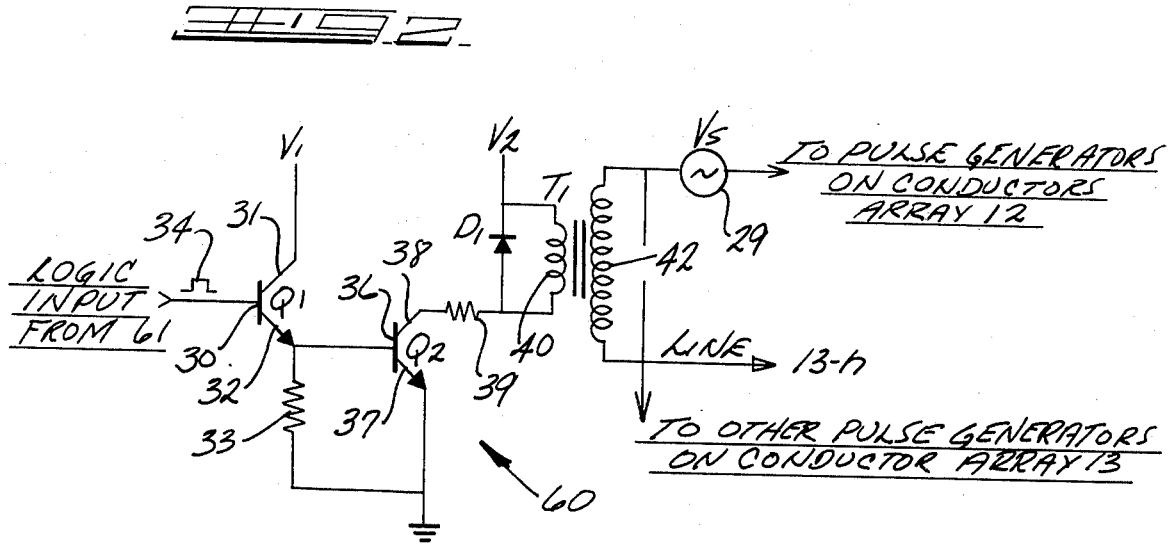
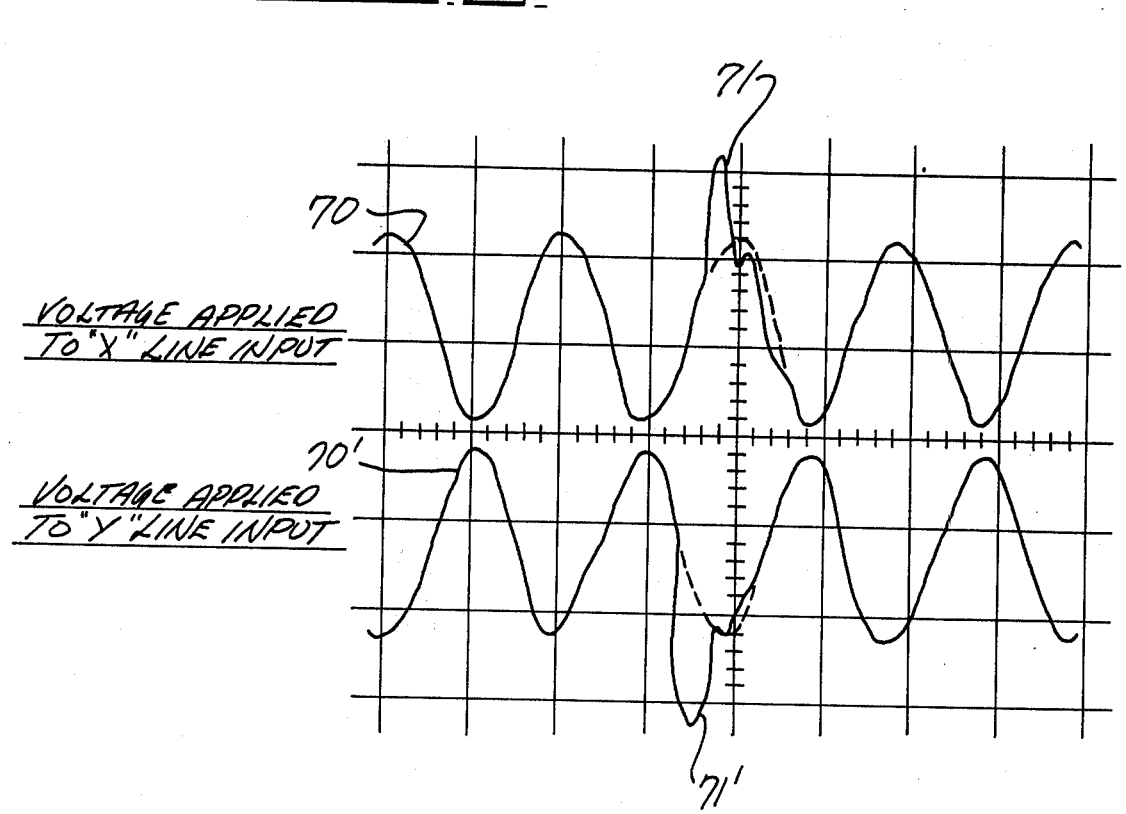

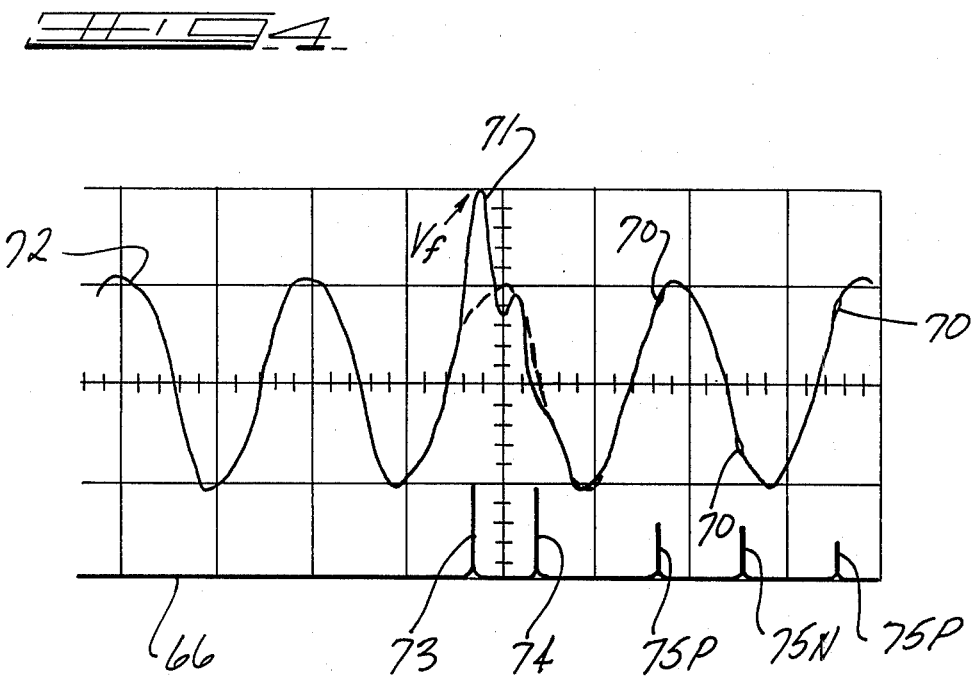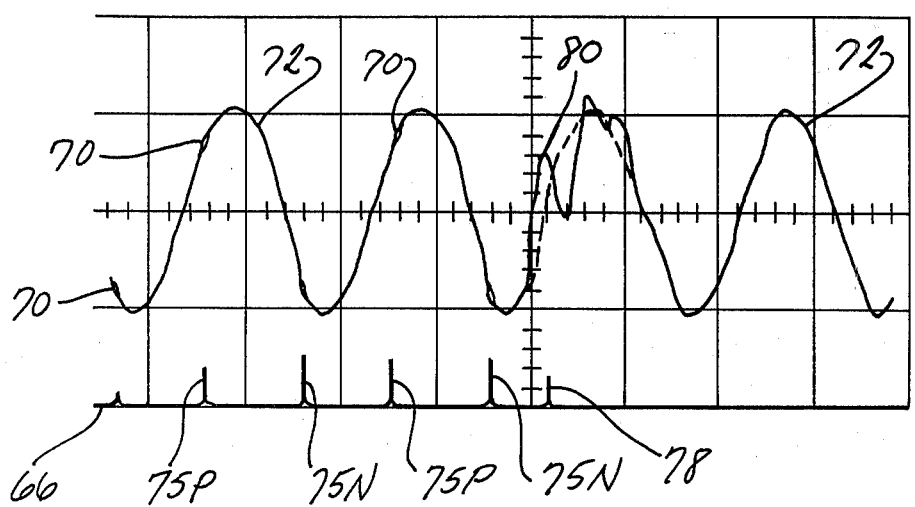

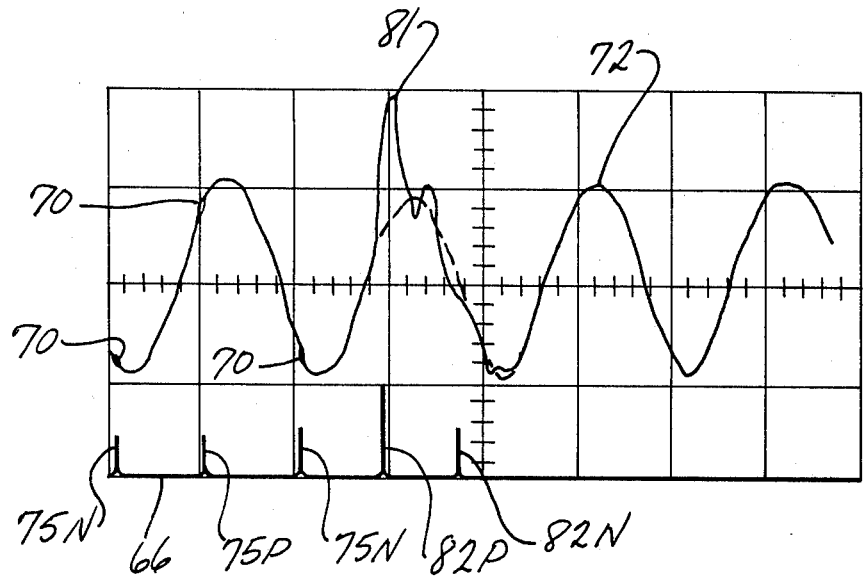
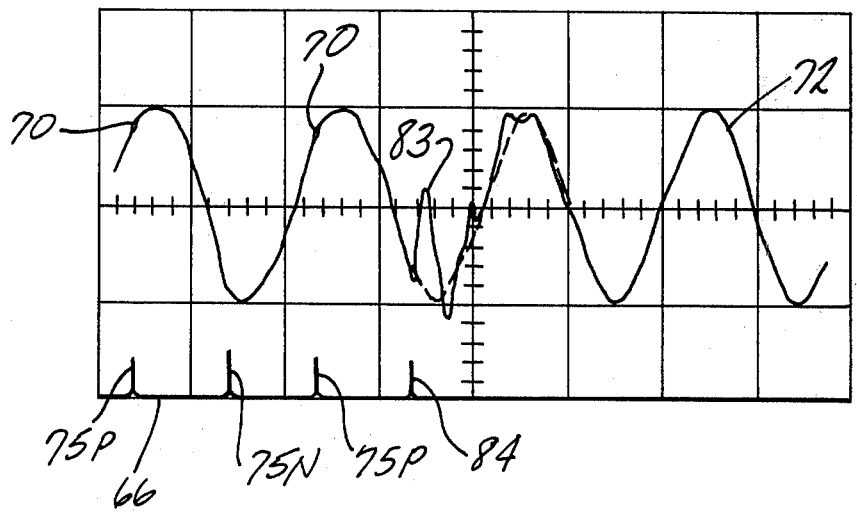

INTERFACING CIRCUITRY AND METHOD FOR MULTIPLE DISCHARGE GASEOUS DISPLAY AND/OR MEMORY PANELS

Under the provisions of 35 U.S.C. 120, this patent application is entitled to an effective filing date of Jan. 19, 1968. It is a continuation-in-part of copending U.S. Pat. application Ser. No. 161,853, filed July 12, 1971, which is a continuation-in-part of U.S. Pat. application Ser. No. 699,170, filed Jan. 19, 1968, now U.S. Pat. 3,618,071.

The present invention relates in general to an interface circuit and method for supplying operating potentials to multiple gas discharge display/memory panels and, in particular, relates to a circuit and method for adding a high voltage unidirectional pulse to a source of sustaining potential at selected time intervals to control operation of selected individual discharge units in a multiple unit discharge gas display and/or memory panel.

The objects of the invention include the provision of a simplified low cost interface circuit between a low voltage addressing logic circuitry and a high voltage gaseous discharge display and/or memory device; the provision of a method of reducing the time required to effect turn on and turn off of individual discharge units in a panel of such discharge units; the prevention of interaction between on-off signals and sustaining signals to the discharge panel, and a method of utilizing the slope characteristics of individual discharge units of a matrix display panel of the electric charge storage type.

The invention will be described in connection with a gas discharge display panel of the type disclosed in the application of Baker, et al., filed Nov. 24, 1967, Ser. No. 686,384 and entitled "Gas Discharge Display-Memory Device and Method", now U.S. Pat. No. 3,499,167.

Multiple gas discharge display and/or memory panels of the type with which the present invention is concerned are characterized by a gaseous medium, usually a mixture of two gases at a relatively high gas pressure, in a thin gas chamber or space between a pair of opposed dielectric charge storage members which are backed by conductor members, the conductor members backing each dielectric member being transversely oriented to define a plurality of discrete discharge volumes and constituting a discharge unit. In some cases, the discharge units may be additionally defined by physical structure such as perforated glass plates and the like. However, in the above identified patent application of Baker, et al., physical barriers and isolation members have been eliminated. In both cases, charges (electrons and ions) produced upon ionization of the gas of a selected discharge unit, when proper alternating operating potentials are applied to selected conductors thereof, are collected upon the surfaces of the dielectric at specifically defined locations and constitute an electrical field opposing the electrical field which created them. It is with respect to the rate of collection of these charges and storage thereof upon the surfaces of the dielectric, namely the slope thereof (electrical slope) and not the magnitude characteristic that the method of the present invention is based.

The above and other advantages and features of the invention will be better understood when considered with the following specification and accompanying drawings wherein;

FIGS. 1A and 1B are diagrammatic illustrations of a gas discharge panel and associated circuit for carrying out the invention, FIG. 2 is an electrical schematic of a preferred form of pulse generating circuit incorporated in the invention, FIGS. 3–7 are wave form diagrams which are used for purposes of explaining the operation of the invention.

With reference now to the drawings, FIGS. 1A and 1B illustrate a gas discharge display/memory panel disclosed in the above-identified Baker, et al. application, in which glass support members 10 and 11 have formed on their opposing surfaces conductor arrays 12 and 13 respectively. Dielectric members or coatings 14 and 16 have surfaces 17 and 18, respectively, which form charge storage surfaces for storage of charges (electrons and ions) generated upon discharge (ionization) of individual discharge units, respectively.

The surfaces 17 and 18 of dielectric members 14 and 16, respectively, are spaced apart by spacer 19 to form a thin gas chamber or space 20 and spacer 19 or an additional sealant 15S may be utilized to form a complete hermetic seal for the gas chamber 20. An ionizable gas medium is placed in gas chamber or space 20 at a pressure of about one-half atmosphere or greater. Support members 10 and 11 are of sufficient size and strength to withstand forces due to any pressure differentials between pressure of the gas within space 20 and ambient pressure and with a minimum deflection. In the disclosed tube there are no physical obstructions or structures in the gas chamber and due to the pressure, a plurality of discrete discharges can occur within chamber 20 without detrimental interaction to the display or memory functions of individual discharge units, even though the conductors of the conductor arrays are spaced no more than at 30 mils center-to-center spacing. It is to be understood that the invention may be applied with equal facility and results to display/memory panels of the type where perforated plates, honeycombs or other physical structures are utilized to provide physical confinement for each individual discharge unit.

The gas may be conditioned (e.g., provided with a supply of free electrons) for the ionization process by application of an initial firing potential to a selected pair of conductors for sufficient time to effect an initial discharge in a discrete gas volume, as for example, a discharge at the discharge unit consisting of the crossing or shadow area of conductors 12-1 and 13-1, the dielectric on those conductors at those crossings or shadow areas and the discrete volume of gas therebetween, the volume of gas permitting photonic communication between all discharge units so that photons which strike or impact the dielectric surfaces produce or cause the release of electrons. Alternatively, the gas may be conditioned by providing an exterior source of ultraviolet radiation for producing by photoelectric emission free electrons for the ionization process or by placing a radioactive material in the glass or gas space which likewise can effect the presence of sufficient free electrons within the gas space for ionization at uniform potentials for a given gas, pressure, panel configuration, etc. At any rate, the invention will be described further in connection with a gas volume (whether unconfined as in the above referenced Baker, et al. patent or confined by a honeycomb or cellular structure as in the prior art) that has been conditioned for the ionization process.

Individual discharge units may be turned "on" (a sequence of momentary discharges on alternate half cycles of applied alternating potential following an initial discharge) and "off" (termination of the sequence) by many different wave forms, the simplest of which is the sinusoidal voltage wave form. Basically, the only condition other than the voltage wave form is that the discharge unit be conditioned such that it is responsive to the applied voltage.

The pulse generator circuit for addressing a conductor of an individual discharge unit is disclosed in FIG. 2 and includes a first transistor Q1 having base 30, collector 31 and emitter 32 electrodes with collector electrode 31 connected directly to a direct current supply V1 and the emitter electrode 32 connected to ground through resistance 33. An input logic signal 34 (about 4 volts having a duration of about 100 nanoseconds) is applied to base electrode 30. This transistor Q1 operates as an amplifier and its output is coupled from emitter 32 directly to base electrode 36 of a second transistor Q2. The emitter electrode 37 of transistor Q2 is connected directly to ground and collector electrode 38 is connected through a small series resistor 39 to primary winding 40 of a transformer T1. The upper end of the primary winding of transformer T1 is connected to relatively high direct current voltage V2 and a diode D1 is connected in shunt or parallel with the primary winding 40 of transformer T1.

When a logic pulse 34 from addressing logic circuit 61 is applied to the base 30 of transistor Q1, this transistor increases the power level sufficiently to turn on transistor Q2 in a switching mode. This switching action is rapid so that a current surge flows through the primary winding 40 of transformer T1 causing a voltage pulse to be produced on the secondary winding. At the end of the input pulse 34, transistor Q2 will turn off stopping the current flow in the primary winding 40 of transformer T1 and a second voltage pulse on the secondary 42 of the transformer is prevented by the diode D1. The diode D1 clips the negative part of the oscillation giving it single half wave output pulse. This diode D1 also serves to protect the transistor Q2 from large transients which may occur during the turn "off" operation. As a practical matter, the input logic pulse 34 is made to have a duration less than half the period to take into account the transistor stored charge which may delay the turning off time of the transistor after the input signal is removed. Addressing logic circuit 61 while complex is conventional and may be of the line scan type of random access type, either of which can supply logic pulses 34 at selected time intervals.

The secondary winding 42 of the transformer T1 is in series circuit with the sustaining signal generator 29 and the line (conductor of the conductor array) being addressed so that the two voltages are added. In order to minimize interaction, the resonant frequency of the sustaining generator and the resonant frequency of the pulse generator are preferably made different so as to reduce power drain and provide maximum signal for application to the panel. The "on"–"off" pulse is adjusted for about a one microsecond duration and the sustaining signal period is about ten microseconds, however, the invention is not limited to these particular time ratios.

The display panel requires a continuous signal applied to all lines, which is referred to as the sustaining signal or voltage. By continuous signal it is meant that the voltage be periodic so that it may be of the simple sinusoidal type or a complex wave shape applied for short time intervals and repeated periodically. The invention will be described in connection with a sinusoidal voltage wave form in the 50 to 500 KHz range. The same sustaining voltage is applied to all "X" lines and a similar voltage is applied to all "Y" lines but at a 180° phase relationship (see FIG. 3). These voltages, as applied to conductors of the conductor arrays on the panel, are balanced with respect to ground to permit the addressing of a single discharge unit within the panel.

In order to lessen the effect of variable capacitive loading on the sustaining voltage generator 29, a capacitance 45 may be connected in shunt with the panel, the larger the panel capacitance change as more discharge units are turned "on", being accommodated by a larger shunt capacitance.

As shown in FIG. 1A, each line on conductor of a conductor array is provided with a pulse generator 60 (e.g., 60-12-1 ... 60-12-n and 60-13-1 ... 60-13-n) which receives a trigger input (logic pulse 34) from addressing circuit 61. For example, when it is desired to address or turn "on" the discharge unit defined by the crossing of conductors 13-1 and 12-1, a logic pulse is applied simultaneously to pulse generator circuit 60-13-1 and 60-12-1 so that unidirectional pulses are added to the out of phase voltages, respectively, from sustaining voltage generator 29. A synchronization connection 90 between sustaining generator 29 and addressing logic circuit 61 is provided so that the logic pulses 34 occur at proper times with respect to the sustaining voltage from sustaining voltage generator 29.

The "on"–"off" state of a discharge unit is indicated in FIGS. 4-7 wherein the lower voltage trace 66 is the voltage output from a photomultiplier (not shown) sensing the individual light bursts emitted from a discharge unit. As earlier noted, a unit discharges or fires twice per cycle of the applied sustaining voltage. The area of photomultiplier voltage pulse varies with the number of electrons involved in a single discharge, and may be taken as an approximate measure of the change in the discharge unit bias voltage. This bias voltage is not an applied voltage as such but is the result of the collection of electrons and ions on opposing discrete surface areas 17 and 18 at each individual discharge unit. The direction of the electric field resulting from the collection of electrons and ions on such surfaces is opposite to the direction of applied field creating (via ionization) them and hence serve to terminate the discharge and thus, the bias voltage alternates with the alternation in direction of applied field and, in opposite directions thereto.

If a sinusoidal voltage on a discharge unit is raised in magnitude to the breakdown level (the firing potential) the discharge unit will discharge. If the amplitude of the applied potential is reduced, the discharge unit will continue to stay on and, in fact, the discharge unit will stay on down to some minimum level of sustaining voltage at which point the discharge unit will go off so that if the applied alternating potential voltage is less than the breakdown or firing voltage but greater than the sustaining voltage level the discharge unit will continue to be in a single firing state. This difference between "on" and "off" voltage levels is utilized as an electrical memory and, as noted above, it is due to alternate storage of charges on the surfaces 17 and 18 of dielectric members 14 and 16 to constitute a discharge unit bias or memory voltage. Where the discharge units are arrayed in horizontal rows and vertical columns served by horizontal and vertical conductor arrays it is important to be able to alter the state of one discharge unit while not affecting the status of others. Moreover, for simplicity purposes, it is desirable to utilize a sinusoidal signal that is at or slightly greater than the sustaining level and to utilize additive voltages on certain conductors to modify the status of selected discharge units.

As suggested above, when a discharge unit discharges, electrons and ions flow across the gas gap in a direction such as to reduce the effect of applied voltage. If the discharge time internally is very short (in the nanosecond range) then the applied voltage does not change appreciably and the change in the voltage across the discharge unit is equal to the breakdown voltage. This presumes that the discharge does not cease at a non-zero voltage, but continues to zero. It was thought that a discharge unit was turned "on" by raising the voltage to the firing potential, and by gradual reduction of voltage to a sustaining level at a rate slow enough to permit the discharges to track. Turn "off" was thought to be accomplished by causing a discharge to occur at a time when the applied voltage was zero. Since the discharge would take the discharge voltage unit to zero, the bias voltage would be reduced to zero causing the discharge unit to be in the "off" state. This, however, does not adequately describe the actual operation for it has been found that a discharge unit can be fired when the applied voltage is zero and still remains in the active state, that is the bias voltage due to charge storage is not reduced to zero.

FIG. 4 illustrates the turn "on" sequence in accordance with the invention. In this wave form diagram, and in those to follow, the dots 70 are superimposed upon the sustaining signal wave form and symbolize a light producing momentary or pulse discharge of a discharge unit and the lower traces symbolize or represent the output of a photomultiplier which has been directed or aimed to a given discharge unit. In other words, the photomultiplier output has been superimposed or added to the sustaining wave form to indicate individual discharge points or firing times during an applied sustaining voltage and as shown, there will be two discharges or pulses of light produced for every full cycle of applied sustaining voltage (light producing discharges on positive half cycles being identified as 75P and light producing discharges on negative half cycles being identified as 75N) once the unit has been discharged or fired. The voltage 71 is the output from the pulse forming circuit which has been added to the sustaining voltage 72. The first discharge 73 is due to the increased applied voltage across the discharge unit (which is the sum of the sustaining voltage and the applied pulse added thereto). Following the application of the initial firing or turn on pulse 71 to the sustaining voltage 72, there is a second momentary discharge represented by the photomultiplier output 74. The slope of applied voltage influences the amount of charge stored on the discharge unit at the end of discharge 73. The stored charge resulting from discharge 73 must be such that discharge 74 will involve that amount of charge necessary to bias the discharge unit "on" so that when the sustaining voltage goes to its positive peak another discharge takes place near the normal discharge point of an "on" discharge unit. Thereafter, the selected discharge unit continues to fire as a normally "on" discharge unit. Since each discharge is terminated upon a buildup or storage of charges at opposed pairs of elemental areas, light produced is likewise terminated. In fact, light production lasts for only a small fraction of a half cycle of applied alternating potential. Storage of such charges constitutes an electrical memory and such stored charges constitute a bias voltage or memory which will effect a discharge again at or near the peak of the half cycle of sustaining voltage to again produce a momentary pulse of light. At this time, due to reversal of field direction, electrons and ions will collect on respective surfaces of the dielectric and after a few cycle of voltage the times of discharges (as represented by dots 70) become symmetrically located with respect to the wave form of sustaining voltage.

In order to turn "off" a selected discharge unit (e.g., terminate a sequence of discharges representing the "on" state), the stored charges (which constitute a discharge unit bias voltage) must be eliminated or modified in such a way that the amplitude of applied voltage, which is the constant amplitude sustaining voltage 72, will be insufficient to effect a discharge. The turn "off" pulse is identical to the turn on pulse and it has been found that the time of application of the turn "off" pulse with respect to the sustaining voltage can effect a turn "off" of a discharge unit if it is applied (1) in synchronism in time such that the pulse tip or peak occurs at the point of a normal discharge, e.g., point 70, or (2) to modify the slope of the next to last discharge, or (3) by having the slopes of the pulse and applied sinusoidal voltages combine to produce a near zero slope condition at the point of the last discharge. These three turn "off" methods are illustrated in FIGS. 5, 6 and 7, respectively. In FIG. 5, prior to application of pulse the discharge unit is "on" and discharging in a single firing mode, namely, twice per cycle (as represented by dots 70 and photomultiplier pulses 75P and 75N). The pulse 80 is synchronized in time so the pulse tip or peak occurs at the point of discharge 70. Due to the near zero slope of the applied voltage, the amount of charge transferred is reduced so as to reduce the discharge unit bias voltage below the sustaining level. That is, the amount of charge stored on the dielectric surfaces is insufficient to result in a potential or field which augments the sustaining voltage to produce a discharge. Thus, the discharge unit is turned "off". Note that the reduced discharge is indicated by the corresponding photomultiplier pulse 78 and the last photomultiplier pulse is considerably shorter than the previous positive cycle photomultiplier pulses indicating a reduction in stored charge.

The second turn "off" method is illustrated in FIG. 6. This method differs from the first in that the turn off is accomplished by modifying the slope on the next to last normal discharge. The slope of the applied voltage 81 is increased on the last positive discharge 82P so as to increase the stored charge and reduce the applied voltage necessary to sustain successive discharge. This causes the next negative discharge to occur at a near zero level. If the slope is correct at the last discharge 82N, the discharge unit will be left with a bias voltage insufficient to fire on the next positive cycle.

The third method of turning "off" a discharge unit is illustrated in FIG. 7. this method is similar to the first in that turn "off" is achieved by having the slopes of pulse 83 and sinusoidal voltage 72 combined to produce a near zero slope condition at the point of the last discharge 84. Notice, however, that the methods differ in that the former turn "off" is done on a positive cycle and the latter on the negative cycle.

Thus, when it is desired to turn off an "on" discharge unit, the turn "off" pulse is applied in such a fashion as to cause the discharge unit to fire at a normal discharge voltage but at a decreased slope thus causing reduced charging of the discharge unit, thus reducing the charge on the discharge unit to below normal charge level which is too low for the sustaining voltage alone to discharge and the discharge unit then remains "off".

The high voltage requirement (up to about 1KV) and frequency range of interest (50 to 500 KHz) determine the current requirements across the panel and shunt capacitance 45.

With reference to FIG. 1A, capacitor 45 may be part of a series tuned circuit including generator 29, and is used to offset both the panel capacitance change and resistive change during a cycle from where no discharge units of a line are "on" to where all discharge units are "on". However, it is desirable to keep capacitor 45 as small as possible so as to limit the required driving current.

The invention is not to be limited to the precise form shown in the drawings for obviously many changes may be made, some of which are suggested herein, within the scope of the following claims.

We claim:

1. A display device arrangement comprising first and second pluralities of conductors arranged so as to define a matrix of crosspoint display cells, and first and second layers of dielectric material disposed between said first and second pluralities of conductors, characterized by a substantially uniform continuous layer of gaseous display material disposed between said first and second layers of dielectric material, means for selectively addressing individual ones of said display cells to initiate a discharge breakdown threat, and sustaining means connected to each of said display cells and operative upon the initial discharge breakdown of individual ones of said cells for thereafter periodically breaking down said individual ones of said cells; and said addressing means comprising respective pulse transformers having secondary windings connected to individual ones of said first and second pluralities of conductors, each said transformer having a primary winding connected to a respective address signal input lead, and wherein said sustaining means comprises an alternating signal source connected to the secondary windings of each of said pulse transformers.

2. In combination, a first layer of dielectric material, a plurality of first conductors disposed on one side of said first dielectric material layer, a second layer of dielectric material, a second conductor disposed on one side of said second dielectric material layer, said first and second dielectric material layers being disposed with the other sides of said first and second dielectric material layers in facing, spaced apart relationship such that said second conductor defines an individual display cell with each of said plurality of first conductors, and a substantially uniform continuous layer of gaseous display material disposed between said other sides of said first and second dielectric material layers, means for addressing a selected one of said display cells to initiate a discharge breakdown through the portion of said gaseous display material between said first and second conductors defining said selected display cell, and sustaining means connected to each of said display cells and operative upon the initial discharge breakdown of individual ones of said cells for thereafter periodically breaking down said individual ones of said cells, said sustaining means comprising an alternating signal source connected to each of said display cells and of a magnitude insufficient to initially break down said cells, said addressing means comprising respective pulse transformers having secondary windings connected to individual ones of said first and second conductors, each said transformer having a primary winding connected to a respective address signal input lead, and wherein said alternating signal source is connected to the secondary windings of each of said pulse transformers.

* * * * *